United States Patent [19]
Pastore et al.

[11] Patent Number: 5,731,709
[45] Date of Patent: Mar. 24, 1998

[54] METHOD FOR TESTING A BALL GRID ARRAY SEMICONDUCTOR DEVICE AND A DEVICE FOR SUCH TESTING

[75] Inventors: John R. Pastore, Leander; Victor K. Nomi, Round Rock; Howard P. Wilson, Austin, all of Tex.

[73] Assignee: Motorola, Inc., Schaumburg, Ill.

[21] Appl. No.: 592,256

[22] Filed: Jan. 26, 1996

[51] Int. Cl.$^6$ ............................................. G01R 31/02
[52] U.S. Cl. .......................... 324/760; 324/755; 324/765
[58] Field of Search .................................. 324/754, 760, 324/758, 761, 755; 29/834; 361/760, 761; 257/697, 698, 706; 439/264, 71

[56] References Cited

U.S. PATENT DOCUMENTS

| | | | |
|---|---|---|---|
| 4,437,141 | 3/1984 | Prokop | 361/403 |
| 4,551,746 | 11/1985 | Gilbert et al. | 357/74 |
| 4,705,205 | 11/1987 | Allen et al. | 439/70 |
| 4,975,765 | 12/1990 | Ackerman et al. | 357/80 |
| 5,018,005 | 5/1991 | Lin et al. | 357/80 |
| 5,258,648 | 11/1993 | Lin | 257/778 |
| 5,293,067 | 3/1994 | Thompson et al. | 257/668 |
| 5,334,857 | 8/1994 | Mennitt et al. | 257/48 |
| 5,355,283 | 10/1994 | Marrs et al. | 361/760 |
| 5,376,010 | 12/1994 | Petersen | 439/71 |
| 5,419,710 | 5/1995 | Pfaff | 439/266 |
| 5,446,960 | 9/1995 | Isaacs et al. | 29/834 |
| 5,467,253 | 11/1995 | Heckman et al. | 361/761 |
| 5,518,410 | 5/1996 | Masami | 324/761 |
| 5,537,051 | 7/1996 | Jalloul et al. | 324/758 |
| 5,552,635 | 9/1996 | Kim et al. | 257/706 |

FOREIGN PATENT DOCUMENTS 60-759   1/1985   Japan.

*Primary Examiner*—Vinh P. Nguyen
*Attorney, Agent, or Firm*—Patricia S. Goddard; Jeffrey S. Abel

[57] ABSTRACT

A ball grid array semiconductor device (30) includes a plurality of conductive balls (36) and a plurality of conductive castellations (18) around its periphery as redundant electrical connections to a semiconductor die (12). During testing of the device in a test socket (50), the conductive castellations are contacted by test contacts (54). The test contacts do not come in physical contact with the conductive balls. As a result, when testing is performed at elevated temperatures near the melting point of the conductive balls, the conductive balls are not deformed by the test contacts, thereby eliminating cosmetic-defects. Additionally, the absence of physical contact between the conductive balls and the test contacts during testing reduces the likelihood that conductive balls will inadvertently fuse to the test socket or create solder build-up on the test contacts.

26 Claims, 5 Drawing Sheets under test conditions which can lead to ball deformation, without the need for a post-test reflow process. An exemplary substrate 10 for use in a BGA semiconductor device in accordance with the present invention is illustrated in the top view of FIG. 1. Substrate 10 is of a type known to those skilled in the art, such as BT resin or polyimide tape, and has a top surface on which is mounted a semiconductor die (not shown). Substrate 10 is of a type known to those skilled in the art, such as BT resin or polyimide tape, and has a top surface on which is mounted a semiconductor die (not shown).

METHOD FOR TESTING A BALL GRID ARRAY SEMICONDUCTOR DEVICE AND A DEVICE FOR SUCH TESTING

FIELD OF THE INVENTION

The present invention relates to testing of semiconductor devices, and more specifically to methods and structures for testing Ball Grid Array semiconductor devices.

BACKGROUND OF THE INVENTION

Ball Grid Array (BGA) semiconductor devices are quickly becoming an industry standard package configuration because BGA devices enable a higher pin count per unit area of a user's board and provide faster accessing times in a use's system as compared to peripherally leaded devices. While BGA devices are gaining acceptance, manufacturing issues with the devices remain which sometimes inhibit their use. Some of these manufacturing issues affect the reliability or performance of the BGA device. Other problems relate to the cosmetic appearance of BGA devices. While a cosmetic problem would seem to be less significant, these problems can nonetheless be a determining factor in whether a user purchases a BGA device.

One cosmetic problem affecting BGA semiconductor devices is the shape of the conductive balls, usually solder balls, which are attached to the bottom side of a wiring substrate in place of conventionally formed leads. After solder balls are positioned on the substrate, the device undergoes a reflow operation which melts the solder and metallurgically joins the solder balls to metal pads on the BGA device substrate. After reflow, the balls have a uniform spherical contour due to natural surface tension forces which act upon the melted solder. It is this uniform spherical ball shape which a user expects in the final device. However, subsequent manufacturing operations can slightly change the shape of the ball. While often times the change in ball shape has no impact on device performance, the fact that the ball is no longer perfectly round causes a user to reject the device.

One such manufacturing process which can lead to ball deformation is that of testing, and particularly testing at elevated temperatures. After the semiconductor device is manufactured, the device undergoes a variety of tests to prove its reliability before being sent to the customer. A conventional method for testing BGA semiconductor devices is through the use of a pogo pin socket. A finished, assembled device is placed in a socket wherein spring-loaded pogo pins contact the plurality of solder balls on the bottom of the device. If the testing is performed at elevated temperatures, the solder material will soften, more so as the testing temperature approaches the melting point of the solder ball material. Upon softening, the force of the pogo pins against the ball will cause the balls to deform. Once testing is complete and the device returns to ambient temperature, indentations in the balls due to the pressure of the pogo pins remain.

One method to fix the deformation in the balls as a result of elevated temperature testing is to re-heat the device after testing is complete to a temperature at or above the melting point of the balls. During this thermal process, the solder balls will reflow, allowing the balls to re-acquire the spherical shape existent before testing. This post-test reflow melts the solder ball material causing natural surface tension forces to produce the desired spherical shape. Upon cooling, each of the balls will again be dose to perfectly round, meeting the customer's expectations.

While post-test reflow will remove obvious deformation of the balls, there are many problems associated with performing a reflow operation after test. One problem is that the devices may have accumulated moisture, such that upon reflowing the solder, the moisture vaporizes and causes the package to crack. To avoid this problem a semiconductor manufacturer might be required to drive off the moisture content through a lower temperature, longer cycle heating operation. Another problem is that the solder balls have a native oxide build-up which affects the ability of the solder material to reflow uniformly. The oxide inhibits or changes the surface tension forces on the solder material, causing the balls to have a wrinkled or raisin-like appearance after reflow. To avoid this problem, the manufacturer would have to apply a flux to the solder balls to remove the oxide layer prior to the reflow operation. A third problem with a reflow process following test is that special handlers for handling singulated BGA devices would be needed for the device to reflow the balls after test. Testing is usually accomplished after individual devices have been singulated from BGA substrate strips, while many processes in the manufacture of BGA devices are designed to handle substrate strips having multiple devices. After processing, the devices singulated from the strip for individual testing. A reflow operation after testing would require special handlers to be made to accommodate as-singulated devices. Accordingly, the solution to solder ball deformation which involves a reflow process after test is not suitable. It requires additional capital expenditures and additional manufacturing time. Therefore, a need exists for an improved testing method for BGA devices which alleviates customer's concerns about deformed conductive balls.

DETAILED DESCRIPTION OF A PREFERRED EMBODIMENT

Generally, the present invention provides a method for testing a ball grid array (BGA) semiconductor device wherein the conductive balls attached to a surface of the substrate are not contacted during a testing operation. Accordingly, even at elevated testing temperatures, no deformation of the balls occurs. Testing is accomplished without physically contacting the balls through the use of a plurality of edge contacts or conductive castellations which are formed around the periphery of the substrate of the BGA device. A test socket is designed to engage or contact the peripheral edge contacts or conductive castellations without contacting the conductive balls during test. Because no external pressures are exerted upon the balls during testing, deformation to the balls does not occur even at elevated temperatures near the melting point of the conductive balls. A further advantage of practicing the invention is that since the conductive balls are not contacted, there is no risk that the balls will melt and fuse to the test contacts, thereby destroying the test socket as well as the device being tested. Moreover in the case of solder balls, the need to clean the test sockets to remove solder build-up from the test contacts is eliminated since the test contacts never come into contact with the solder balls during the testing operation.

These and other features and advantages of the present event will be more clearly understood from the following detailed description taken in conjunction with the accompanying drawings. It is important to point out that the illustrations are not necessarily drawn to scale, and that there are likely to be other embodiments of the present invention which are not specifically illustrated.

Figure 1:
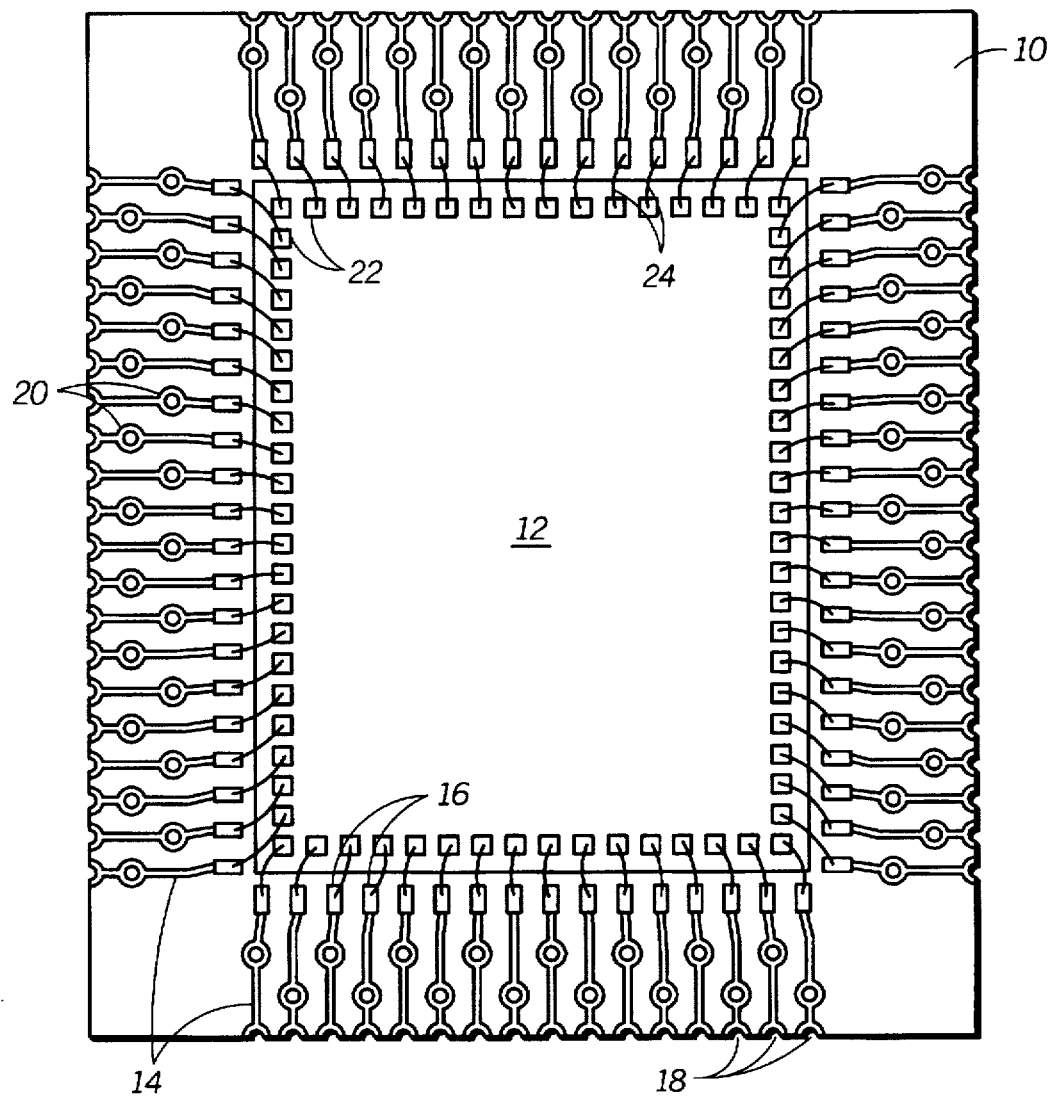
FIG. 1 is a top view of a substrate for use in a BGA semiconductor device in accordance with the present invention.

FIG. 1 is a top view of a top surface of substrate 10 having a semiconductor die 12 mounted thereto. Substrate 10 includes a plurality of conductive traces 14. On the illustrated top surface, one end of each conductive trace on the top surface terminates into a bonding finger 16. An opposing end of each conductive trace terminates at a conductive castellation 18 at the periphery of the substrate. Between the bonding finger and the conductive castellation associated with each trace is a conductive via 20.

For each conductive trace on the top surface of substrate 10, there is an associated bonded finger 16, an associated conductive castellation 18, and an associated conductive via 20. This associated relationship is more clearly illustrated in a magnified view of substrate 10 in FIG. 2. As FIG. 2 demonstrates, each of the four traces illustrated has its own bonding finger, its own conductive castellation, and its own conductive via associated therewith. For instance, conductive trace 14' has a bonding finger 16', a conductive castellation 18' and a conductive via 20' associated therewith, and conductive trace 14" has a bonding finger 16", a conductive castellation 18" and a conductive via 20" associated therewith.

Figure 2:
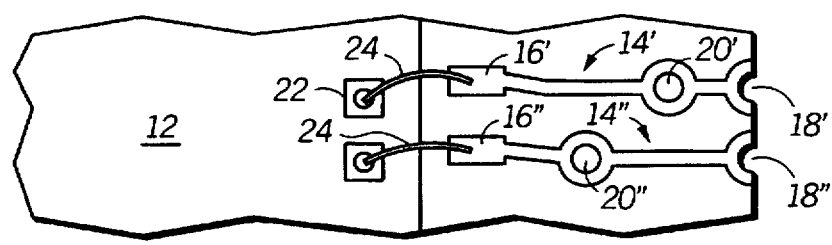
FIG. 2 is a magnified view of a portion of the substrate illustrated in FIG. 1.

FIGS. 1 and 2 also illustrates how semiconductor die 12 is electrically connected to the conductive traces on the top surface of substrate 10. Specifically, semiconductor die 12 includes a plurality of bonding pads 22 which serve as input/output terminals of the die. As illustrated, bonding pads 22 are formed around a periphery of semiconductor die 12. The bonding pads are electrically connected to the integrated circuitry (not shown) of the semiconductor die in a conventional manner (e.g. through metal layers and contacts formed in the die). The bonding pads are electrically connected to conductive traces 14 through the use of wire bonds 24 which connect bonding pads 22 to bonding fingers 16. Wire bonds 24 are typically made of a gold or aluminum material and are bonded to the bonding pads and bonding fingers using conventional techniques. While the electrical connection between semiconductor die 12 and substrate 10 is herein described through use of wire bonds, it is important to realize that other connection mechanisms can also be used in conjunction with the present invention. For example, flip-chip techniques, such as controlled collapse chip connection (C4), can be utilized to connect an array of conductive bumps formed on a chip to an array of bonding fingers or bonding pads on a substrate.

Substrate 10 as used in accordance with one embodiment of the present invention can be manufactured using conventional substrate manufacturing techniques. While the bulk material of this substrate is not limited by the practice of this invention, it is likely that the most beneficial use of the present invention is in conjunction with organic substrates, such as epoxy-based resin substrates, including bismaleimide triazine (BT) resin. While there is no apparent reason why other substrate materials, such as ceramics, cannot be used in conjunction with the present invention, organic substrates are particularly susceptible to deformed solder balls as a result of testing at elevated temperatures. The susceptibility of organic substrates is due to the fact that the solder ball composition used in conjunction with an organic substrate is typically a eutectic or near-eutectic solder composition (63% tin and 37% lead) which has a melting point which is lower than other solder compositions. The melting point for eutectic solder is about 184° C. Other substrate materials, including ceramic substrates, often utilize higher temperature solder materials, for example a 97% tin and 3% lead composition which has a melting point of about 230° C. Accordingly, elevated testing temperatures at 125°–150° C. will have a more severe impact in deforming eutectic solder balls as compared to other compositions. Therefore, organic substrates are more prone to deformed balls as a result of testing at elevated temperatures.

Rather than specifying the benefits of the present invention based on the substrate material, perhaps a better correlation is to the actual testing conditions utilized. For example, the present invention is likely to benefit any testing operation for BGA devices wherein the testing is performed above ambient temperature. More specifically, the present inventions benefits testing performed at or above 50° C., and even more specifically performed within 50° C. of the melting point of the conductive ball material. The likelihood that conductive balls will deform during testing is also a function of time or duration of the test. The longer the test, the more likely deformation will occur even at lower temperatures. Accordingly, the present invention can also be related to testing times. Testing times in excess of one or two minutes will benefit from practicing the invention, but a larger benefit will be achieved for testing times in excess of one hour, and even larger for times in excess of one day.

The formation of conductive traces 14, bonding fingers 16, conductive castellations 18, and conductive vias 20 can be formed on substrate 10 in accordance with conventional manufacturing practices. For example, in the case of organic substrates, each of the conductive members may be formed by first laminating a conductive layer, for example copper, onto a dielectric sheet. Following lamination, a lithography process can be used to mask or pattern the metal layer. The masked metal layer is then etched to form the desired conductive pattern for the members. Conductive vias 20 and conductive castellations 18 can be formed through conventional punching or drilling operations to form holes through the substrate either before or after patterning the metal layer. After drilling or punching the holes in the substrate are then plated with a conductive material to make the holes in the substrate conductive throughout. Castellations 18 can be formed by first forming a conductive via in the substrate (preferably simultaneously with the formation of vias 20), and then subsequently excising or cutting the substrate through a row of vias. Stated otherwise, conductive castellations can be thought of as half-vias, wherein one half of a via has been removed or cut away, leaving the other half of the via in place to form the conductive castellation.

Figure 3:
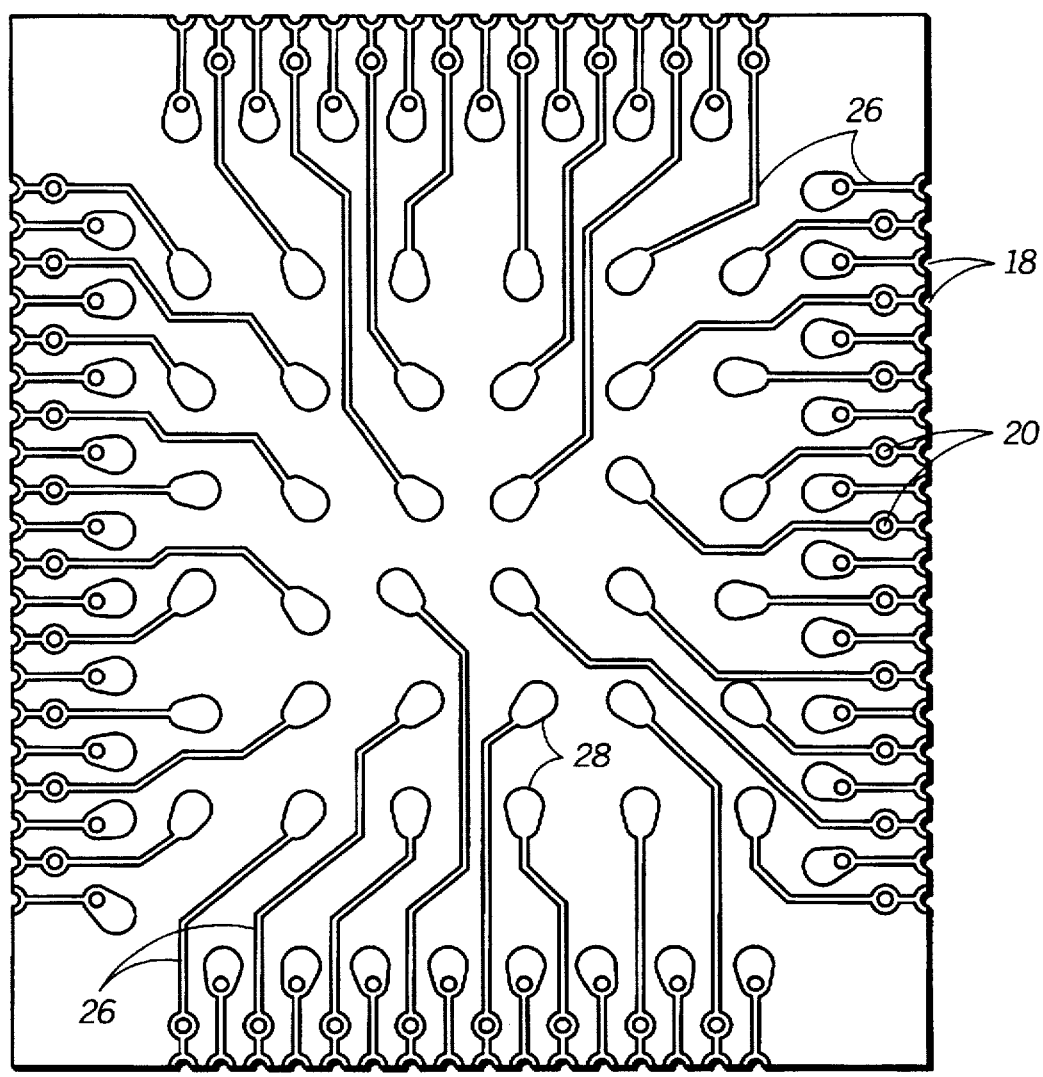
FIG. 3 is a view of a bottom surface of the substrate illustrated in FIG. 1.

FIG. 3 illustrates substrate 10 from a bottom view. The conductive castellations and conductive vias of FIG. 1 are replicated in FIG. 3, as these elements extend entirely through the thickness of the substrate. It is noted, however, that in place of through vias which extend directly from a top surface to a bottom surface of the substrate, a substrate used in accordance with the present invention can also or instead utilize blind or buried vias, particularly in a multi-layer substrate. Buried vias are vias which are completely internal to the substrate, without extending to either a top or bottom surface of the substrate, while blind vias are vias which include one internal end, and one end which extends to either the top or bottom surface of the substrate.

Also illustrated in FIG. 3 and present on the bottom of substrate 10 is another plurality of conductive traces 26 which is used to route the plurality of conductive vias 20 to corresponding conductive ball receiving areas 28. As in FIG. 1, which illustrates that each conductive trace 14 has its own associated conductive via and conductive castellation, each conductive trace 26 on the bottom of substrate 10 has its own associated via and conductive castellation. Accordingly, there is an association between each conductive trace on the bottom of the substrate and each conductive trace on the top of the substrate. This relationship, which happens to be a one-to-one or exclusive relationship as illustrated, is what enables semiconductor die 12 to be electrically accessed through conductive balls which are eventually attached to conductive ball receiving areas 28 on the bottom of the substrate.

As indicated in FIG. 3, conductive ball receiving areas 28 are arranged in an array configuration rather than being located along peripheral portions of substrate 10. The array configuration of the conductive ball receiving areas is what enables the footprint, or area, of a final BGA semiconductor device to be reduced in comparison to conventional peripherally leaded packages. In essence, the conductive traces on the top of the substrate are used to "fan-out" the connections at the die to the plurality of the vias, while the conductive traces on the bottom of the substrate are used to "fan-in" the plurality of conductive vias to the array of conductive bails. Although as illustrated the conductive ball receiving areas 28 are pear-shapes, such is not a requirement for practicing the present invention. Round receiving areas are suitable as well.

Figure 4:
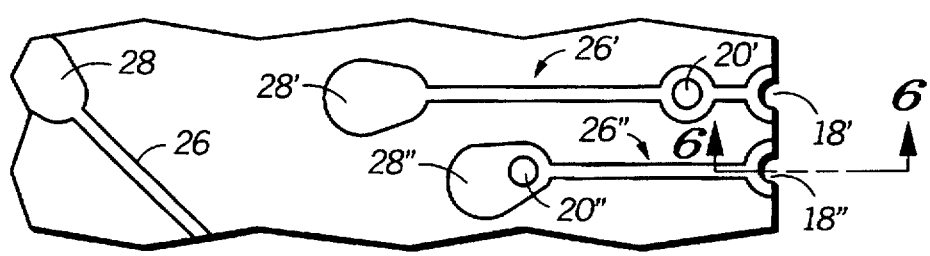
FIG. 4 is a magnified view of a portion of the bottom surface of the substrate illustrated in FIG. 1.

A magnified view of a portion of the bottom of substrate 10 is illustrated in FIG. 4. As FIG. 4, demonstrates, each of the four traces illustrated has its own conductive castellation, and its own conductive via associated therewith. For instance, conductive trace 26' a conductive castellation 18' and a conductive via 20' associated therewith, and conductive trace 26" has a conductive castellation 18" and a conductive via 20" associated therewith.

Figure 5:
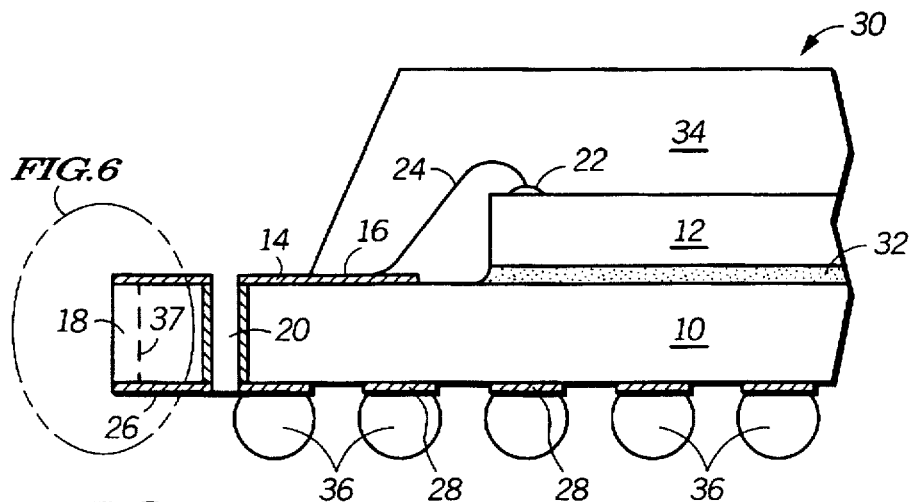
FIG. 5 is a partial cross-sectional view of a BGA semiconductor device in accordance with the present invention.

FIG. 5 is a cross-sectional illustration of a portion of a fully assembled BGA semiconductor device 30 in accordance with an embodiment of the present invention. Device 30 includes substrate 10 as excised or singulated from a larger sheet or strip containing multiple device sites. As illustrated the substrate includes a conductive trace 14, a bonding finger 16, a conductive castellation 18, a conductive via 20, a conductive trace 26, and conductive ball receiving areas 28 as previously described. Also illustrated in FIG. 5 is an adhesive die attach material 32 which is used to attach semiconductor die 12 to a surface of substrate 10. Also included in device 30 is an encapsulation material 34 which in a preferred form is a plastic resin encapsulant when using an organic substrate. Other encapsulation means, for example a lid, can instead be used to protect semiconductor die 12. In its finished form, semiconductor device 30 also includes a plurality of conductive balls 36 which when using an organic substrate are preferably solder bails having a composition of tin and lead at or near eutectic solder, with or without slight alloying with another metal such as silver.

Figure 6:
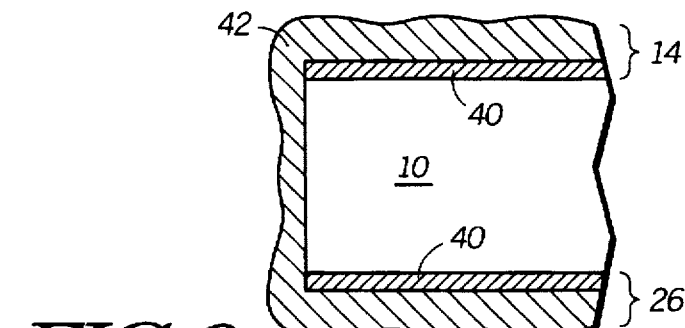
FIG. 6 is an exploded cross-sectional view of a portion of the peripheral edge of the substrate illustrated in FIG. 5.

The cross-sectional view of FIG. 5 is taken through the largest lateral dimension of semiconductor device 30 and of substrate 10, thus conductive castellation 18 is really hidden in the view of FIG. 5. Thus, the castellation is represented by dotted line 37. FIG. 6 is a magnified cross-sectional view of the peripheral portion of substrate 10 taken through a conductive castellation 18. In other words, the cross-section is taken through the smallest lateral dimension of the substrate. Thus the portion of conductive castellation 18 illustrated in FIG. 6 is the farthest recessed portion relative to the perimeter of the substrate. Remaining portions of the conductive castellation exist in another plane and are thus not illustrated in FIG. 6. For further clarity as to the view which FIG. 6 illustrates, FIG. 4 includes a line 6—6 through a conductive castellation which is comparable to the view in FIG. 6.

The view of FIG. 6 is intended to show the manner in which vias and castellations are made conductive in a typical manufacturing process. The present invention takes advantage of these current manufacturing techniques to improve testing processes used to test BGA semiconductor devices. In a typical process for making an organic substrate, the conductive traces 14 and 26 formed on the top and bottom of the substrate, respectively, are formed by first laminating a conductive layer 40, typically copper, on each surface of the bulk insulating material of the substrate. As mentioned previously, this laminated layer is lithographically patterned and etched to define the desired conductive trace pattern. Holes are formed in the substrate by drilling or punching, but as formed initially are non-conductive. An electroless plating operation is performed to deposit a thin plating layer on the sidewalls of the holes or vias, followed by an electrolytic plating process to build-up the plating layer thickness. The final composite plating layer is illustrated as a single plating layer 42 in FIG. 6 for ease of illustration. The plating materials used are typically copper, nickel, and/or gold. As is apparent in FIG. 6, the deposition of the plating layer along the sidewalls of the vias and/or castellations is typically thinner than on the top and bottom surfaces of the substrate. Moreover, deposition is thickest at the corners or edges where a via meets the top and bottom surface planes. As explained subsequently, the present invention utilizes the thickest portions of the plating layer, and where both the plating layer and conductive layer exist to achieve the most reliable electrical contact to the semiconductor device during test.

Thus far, a BGA semiconductor device has been described which includes a plurality of conductive castellations around a periphery of the BGA device which are redundant electrical connections to the conductive traces and conductive vias which couple the semiconductor die to conductive bails of the device. Accordingly, the BGA device can be tested by contacting only the conductive castellations without physically contacting the conductive balls of the device. Since the conductive balls are not contacted during test, there is no risk of deforming the balls, and thus no risk of cosmetic based rejections by the customer.

In order to test a BGA semiconductor device using the conductive castellations as herein described, a test socket such as that described in reference to FIGS. 7-11 can be used. However, it is understood that the test socket hereafter described is not the only test socket which might be suitable for testing a BGA semiconductor device in accordance with the present invention. The test socket illustrated and described is intended only to show that a suitable test socket can be designed in accordance with conventional test socket techniques.

Figure 7:
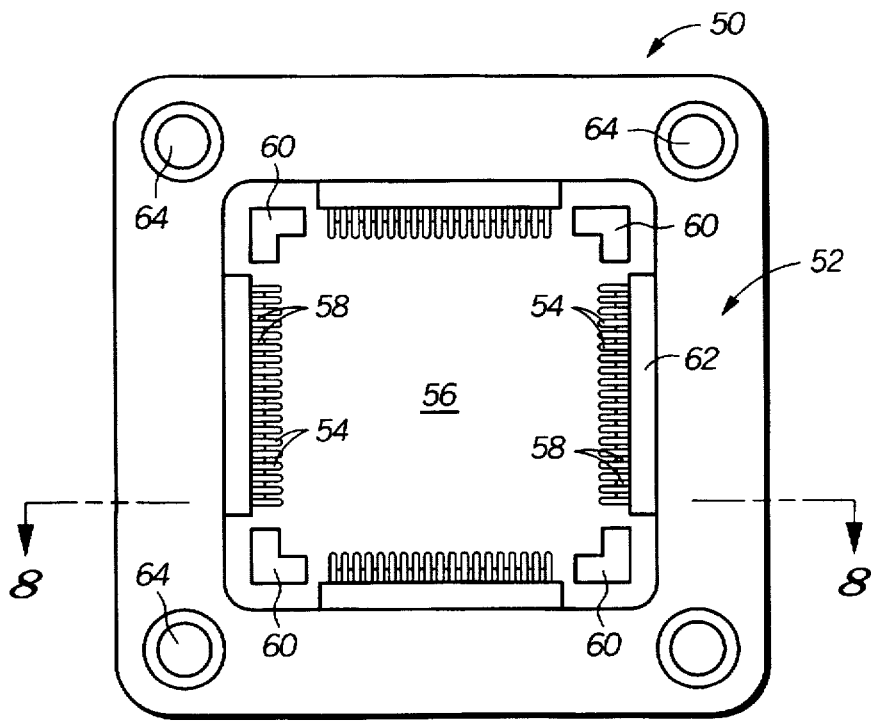
FIG. 7 is a top view of a test socket suitable for testing a BGA semiconductor device in accordance with the present invention.

FIG. 7 is a top-down view of a test socket 50 which is suitable for testing a BGA semiconductor device, such as device 30, in accordance with the present invention. Test socket 50 includes a plastic housing 52 which encircles the device to be tested and houses a plurality of test contacts 54 used for testing the device. A device receiving area 56 is in the form of an opening in the center of housing 52. Test contacts 54 exist along peripheral portions of device receiving area 56 so that upon insertion of the BGA semiconductor device, test contacts 54 will be able to contact the conductive castellations formed around the perimeter of the BGA device. Also included in test socket 50 are plastic spacers 58 which exists between each of the test contacts to establish and maintain separation between adjacent test contacts. Within device receiving area 56, test socket 50 is provided with corner guides 60 to facilitate insertion and alignment of a BGA device within the test socket. For proper orientation of the device, one of the corner guides can be configured differently than the remaining corner guides, for example as a "pin one" indicator. Housing 52 of test socket 50 also includes stopper portions 62 along each of the four sides of the device receiving area 56. The purpose of the stopper portions is described subsequently in reference to FIGS. 8 and 9. Test socket 50 also includes connectors 64, also described in reference to FIG. 8.

Figure 8:
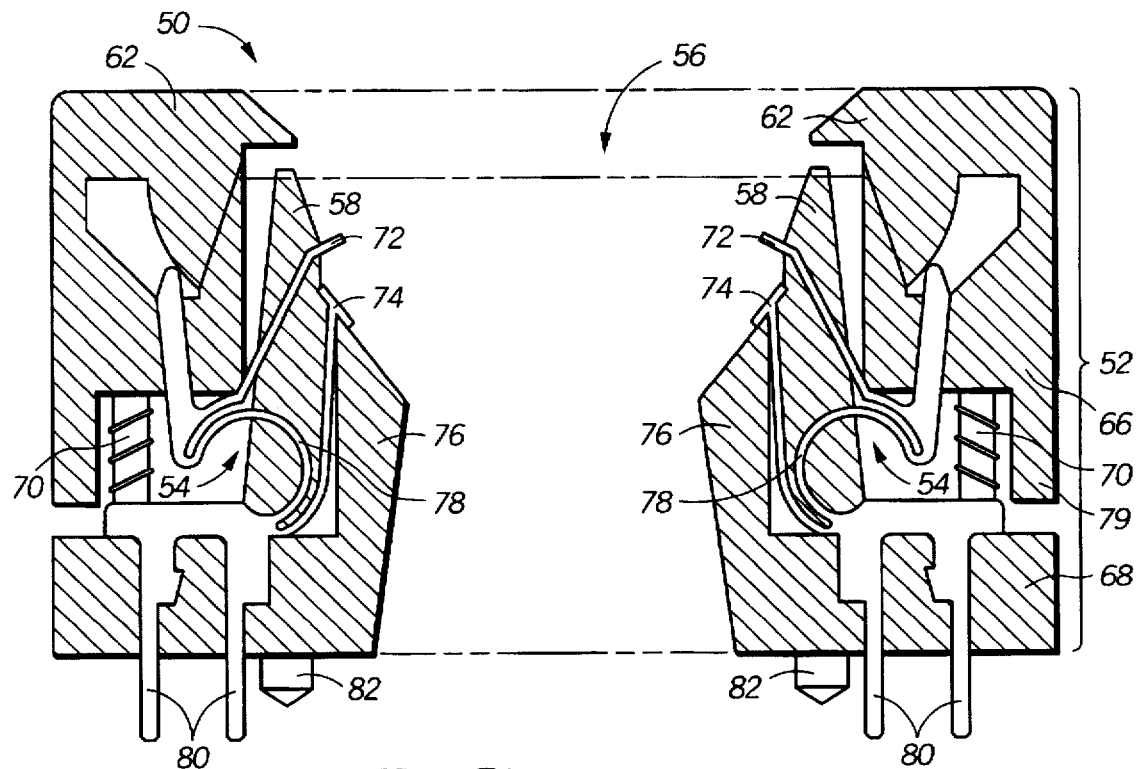
FIG. 8 is a cross-sectional illustration of the test socket illustrated in FIG. 7, wherein the test socket is in a closed position.

FIG. 8 is a cross-sectional view of test socket 50 taken along the line 8—8 of FIG. 7. As illustrated in FIG. 8, plastic housing 52 of the test socket contains two major portions, a top portion 66 and a bottom portion 68. Connectors 64 of the test socket (illustrated in FIG. 7) are used to connect the top and bottom portion. Without forces applied to the test socket, the top and bottom portion of housing 52 are spaced apart from one another. However as will subsequently be explained, the top and bottom portions of the housing are pushed together, using springs 70, to load the device to be tested. Accordingly, connectors 64 which connect the top and bottom portions together should not restrain the physical movement of the two portions relative to one another for this purpose.

Figure 9:
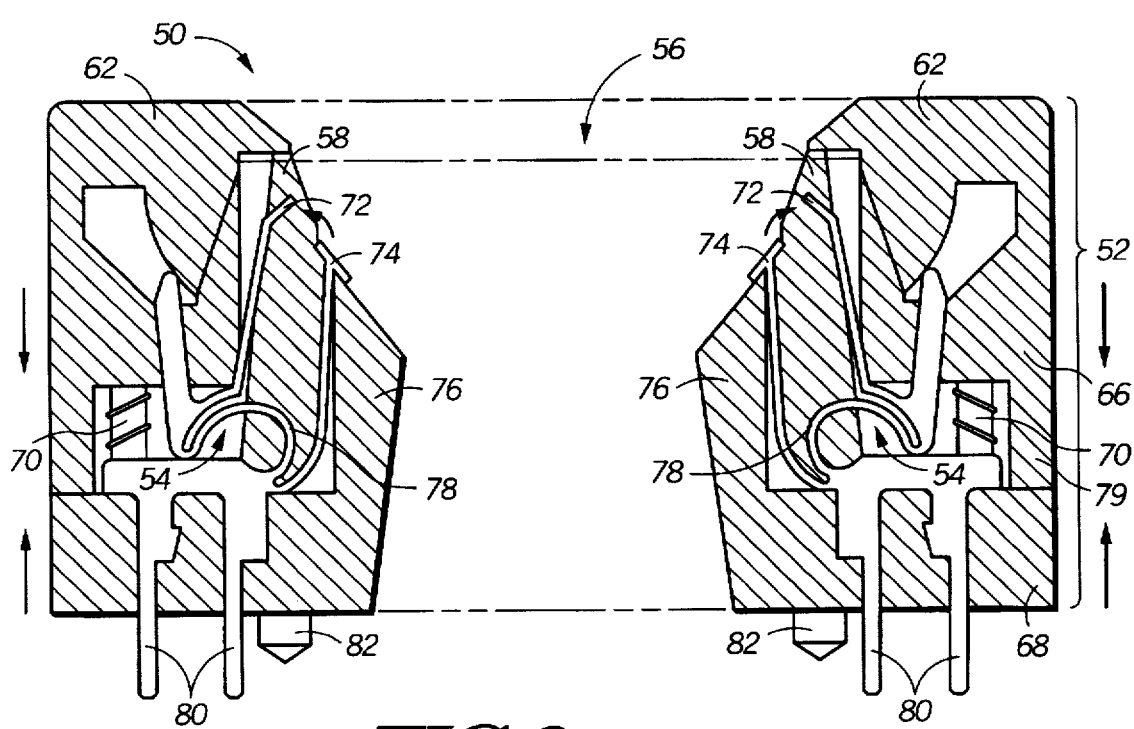
FIG. 9 is a cross-sectional illustration of the test socket of FIG. 7, wherein the test socket is in an open position.

In the view of FIG. 8, two test contacts 54 are illustrated. Each test contact includes a top contacting portion 72 and a bottom contacting portion 74. The top contacting portions are used to contact the conductive castellation near the top surface of the substrate, while the bottom contacting portion 74 will contact the conductive castellation near the bottom surface of the substrate. Bottom contacting portion 74 is held stationary in its position by a support portion 76 which is integrated into the bottom portion 68 of housing 52. Top contacting portion 72 of the test contact is connected to bottom contacting portion 74 through a spring portion 78. Upon pressing top portion 66 of the housing toward bottom portion 68, and compressing springs 70, the spring portions 78 of the test contacts 54 are likewise compressed, causing top contacting portions 72 of the test contacts to retract. FIG. 9 illustrates how such compression causes the top contacting portion 72 to retract. The arrows of FIG. 9 indicate the direction of forces applied to the test socket causing the top and bottom portions to be brought together. As FIG. 9 illustrates, the forces of the top portion of housing 52 upon test contacts 54, causes the top contacting portions of the test contacts to be drawn farther away from the center of device receiving area 56.

The retraction of the top contacting portion 72 of the test contacts is needed in order to get the semiconductor device properly fitted within the test contact. In the "closed position" (as illustrated in FIG. 8), it would be rather difficult to insert a semiconductor device between the top and bottom contacting portions of the test contacts without damaging either. Accordingly, test socket 50 is designed such that upon compression of the top and bottom portions of the socket housing, the top contacting portions of the test contacts are retracted to allow insertion of the BGA device without damage to the test contacts.

Test contacts 54 can be insertion fitted into the bottom portion 68 of housing 52. Upon insertion, pin portions 80 of the test contacts extend through the bottom portion of the housing. Pin portions 80 are for insertion into the test board. Alignment or guide pins 82 can also be included in the bottom portion of the test socket to facilitate insertion or connection of the socket to the test board. Upon compression of the top portion and bottom portion of the housing together, stopper portions 62 can be utilized to control the amount of compression. For example, as illustrated in FIG. 9, stopper portions 62 are designed to hit upon plastic spacers 58 to limit the extent to which the top and bottom portions can be brought together. Other protrusions, such as protrusions 79, can also be incorporated into either the top portion 66 or bottom portion 68 of the housing to control the extent of compression.

Figure 10:
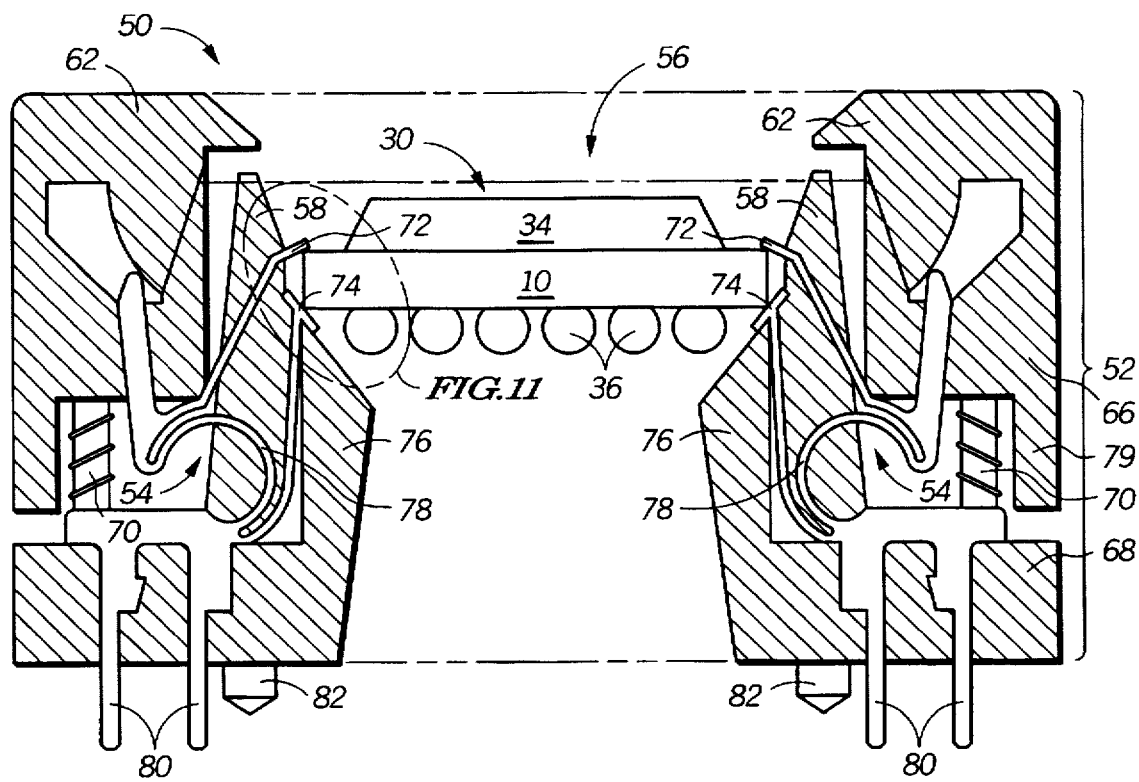
FIG. 10 is a cross-sectional illustration of the test socket of FIGS. 7–9, as the socket holds a BGA semiconductor device in accordance with the invention.

FIG. 10 illustrates test socket 50 in its closed position after BGA semiconductor device 30 has been placed therein. Device 30 is placed in the test socket by compressing the top and bottom portions of the housing together, causing the test contacts to retract to their "open position" as illustrated in FIG. 9. The device is then inserted into the device receiving area 56, using corner guides 60 to adjust and control the position of the device within the device receiving area. Once the device is properly positioned, the compressive forces against the top and bottom portions of the housing are removed, causing the test contacts to revert to their closed position as illustrated in FIG. 10.

Figure 11:
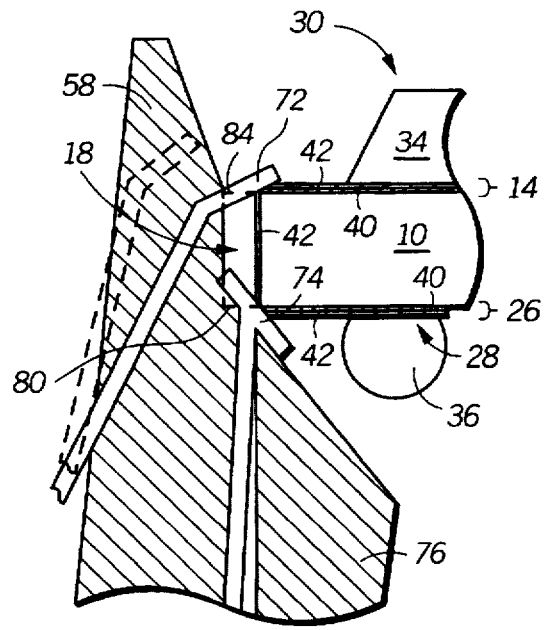
FIG. 11 is an exploded view of how the test contacts of the test socket contact the semiconductor device in accordance with an embodiment of the present invention.

The manner in which test contacts 54 contact the conductive castellations of BGA semiconductor device 30 is more clearly illustrated in reference to FIG. 11, which is a magnified view of a portion of FIG. 10. As illustrated in FIG. 11, top contacting portion 72 of the test contact contacts conductive castellation 18 near the, top surface of substrate 10 when the socket is in its closed position. By contacting the conductive castellation near the top surface, the reliability of the connection is improved as compared to simply contacting the sidewall portion of the conductive castellation. As shown previously, the thickness of the conductive materials is greater at the top surface and at the bottom surface than along the sidewalls of the vias or castellations. Accordingly, more reliable connections can be made by contacting the thicker portions of the conductive materials. Likewise, bottom contacting portion 74 contacts conductive castellation 18 near a bottom surface of substrate 10, thereby also benefiting from making a connection to a thicker portion of the conductive materials. As illustrated in FIG. 10, the narrowest lateral width of substrate 10 is illustrated. At the widest dimensions of the substrate, the substrate edge can abut or be aligned to plastic spacer 58 as indicated by dotted line 84.

Once BGA semiconductor device 30 is positioned and closed within test socket 50, testing can be performed on the device by using the test contacts. As illustrated in FIG. 11, no physical contact is made to conductive balls 36 during testing. The balls are present within device receiving area 56 without imposition of physical forces exerted upon them by the test contacts during testing. Accordingly, deformation of the solder balls during test, even at elevated temperatures, cannot occur.

Testing of BGA semiconductor device 30 in accordance with the present invention can occur using any number of tests which are traditionally performed upon semiconductor devices. For example, a test can be performed merely to test whether or not open circuits or short circuits exist within the device or die. Additionally, a BGA semiconductor device can be tested in accordance with the present invention for full functionality. An additional type of test which can be performed in accordance with the present invention, and perhaps a test which benefits the most from the present invention, is a burn-in test. In a typical burn-in process, semiconductor devices are baked for anywhere from 10–150 hours at elevated temperatures, for example between 125°–150° C. During this baking process, the devices are at least biased (i.e. power is applied to the device, known as static burn-in) and sometimes exercised (i.e. electrically signals, such as instructions, are being delivered to the device, known as dynamic burn-in). Burn-in processes perhaps benefit the most from utilizing the present invention since the temperature at which burn-in is performed is typically higher than the temperatures at which open and short testing or functional testing is performed. Temperatures used at burn-in approach the melting temperature of solder balls on a BGA device. Furthermore, burn-in is typically one of the longer electrical tests performed on a device. Burn-in is on the order of hours, while functional testing is on the order of minutes, and open/shorts testing is on the order of seconds. Accordingly, most of the deformation of conductive balls which occurs in prior art techniques for testing utilizing pogo pins, or other ball contacting regimes, occurs at burn-in testing. The present invention can be utilized to eliminate the deformation at burn-in by utilizing the conductive castellations or other form of peripheral edge contacts rather than relying upon the conductive balls on the substrate to establish connection to the device.

The foregoing description and illustrations contained herein demonstrate many of the advantages associated with the present invention. In particular, it has been revealed that a BGA semiconductor device can be designed to include redundant conductive castellations or other form of edge contacts as a means for testing the semiconductor device, rather than relying upon the conductive balls to establish electrical connection to the device during test. By utilizing the peripheral castellations or contacts, no physical contact is made to the conductive balls, such that even at elevated temperatures no deformation of the conductive balls will occur. A further benefit of not contacting the conductive balls during test is that at elevated temperatures there is no risk that upon reaching the melting point of the conductive balls the balls will fuse with the test contacts in the socket. Furthermore, without contacting the balls during testing there is no need to remove solder build-up on the test contacts. In sum, the present invention not only reduces the number of defects in a BGA semiconductor manufacturing process by eliminating cosmetic defects to the solder balls, but the present invention also reduces damage to test sockets which can occur when testing at elevated temperatures.

Thus it is apparent that there has been provided in accordance with the invention a method for testing a BGA semiconductor device, and a BGA device for such testing, that fully meets the need and advantages set forth above. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the test socket herein described was merely exemplary of a test socket suitable for testing a BGA semiconductor device in accordance with the present invention. There is no requirement that a test socket used for testing such a device include both top and bottom contacting portions. A single contacting portion which contacts either the top, the bottom, or a side portion of an edge contact can be suitable for practicing the invention. Moreover, the shape and configuration of the test contact, or the test socket itself, is not restricted by the present invention. For example, a test socket used in accordance with the invention need not rely upon the insertion technique herein described. Furthermore, it is not required that the edge contacts be in the form of conductive castellations. Conductive castellations are preferred because they can easily be included in existing substrate manufacturing processes with an additional cost equal to only that of drilling or punching additional holes (preferably where the vias formed for the castellations are drilled or punched at the same time the vias are drilled or punched for the through vias. Other substrate manufacturing processes and test sockets may be more conducive for including other forms of edge contacts. Accordingly, such contacts are intended to be within the scope of the present invention. Furthermore, it is important to realize that the type of testing one subjects the BGA semiconductor device to is not restricted by the present invention. Moreover, while the invention is intended to be utilized with elevated temperature testing, elevated temperatures are not required. For example, a semiconductor manufacturer may want to use the same test socket at various stages of the manufacturing process. While one of these stages may be at elevated temperatures, another stage may not be. However, it would be desirable for the manufacturer to utilize the same socket design for each testing stage such that the socket is used in the absence of elevated temperatures in at least one testing stage. Therefore, it is intended that this invention encompass all such variations and modifications as fall within the scope of the appended claims.

We claim:

1. A method for testing a ball grid array semiconductor device comprising the steps of:

providing a semiconductor device having a substrate with a periphery, a plurality of conductive vias formed in the substrate, a semiconductor die mounted on the substrate and electrically coupled to the plurality of conductive vias, a plurality of conductive balls attached to the substrate and electrically coupled to the semiconductor die through the plurality of conductive vias, and a plurality of conductive castellations formed around the periphery of the substrate and electrically coupled to the semiconductor die, wherein each conductive ball of the plurality of conductive balls has an associated conductive castellation of the plurality of conductive castellations and wherein the associated conductive castellation of the each conductive ball has an associated conductive via of the plurality of conductive vias;

providing a test socket for receiving the semiconductor device and having a plurality of test contacts;

placing the semiconductor device in the test socket such that the plurality of test contacts is electrically and physically in contact with the plurality of conductive castellations and without being in physical contact with the plurality of conductive balls; and biasing the semiconductor device using the plurality of test contacts and the plurality of conductive castellations to send at least power to the semiconductor die without the plurality of test contacts physically contacting the plurality of conductive balls.

2. The method of claim 1 wherein the step of biasing is performed at a temperature above an ambient temperature.

3. The method of claim 2 wherein the step of biasing comprises burning-in the semiconductor device.

4. The method of claim 3 wherein the step of biasing comprises burning-in the semiconductor device at a temperature within 50° C. of a melting point of the plurality of conductive balls.

5. The method of claim 1 wherein the step of biasing comprises functionally testing the semiconductor device.

6. The method of claim 1 wherein the step of biasing comprises testing the semiconductor device for open circuits and testing the semiconductor device for short circuits.

7. The method of claim 1 wherein the steps of providing a semiconductor device comprises providing a semiconductor device wherein the associated conductive via and the associated conductive castellation are associated exclusively.

8. A method for testing a ball grid array semiconductor device comprising the steps of:

providing a substrate having a top surface, a bottom surface, periphery, a first plurality of conductive traces formed on the top surface, a second plurality of conductive traces formed on the bottom surface, a plurality of vias extending through the substrate, and a plurality of conductive contact portions formed around the periphery of the substrate, wherein each via of the plurality of vias is used to electrically connect a conductive trace from the first plurality of conductive traces on the top surface to an associated conductive trace of the second plurality of conductive traces on the bottom surface, and wherein for each via of the plurality of vias there is an associated conductive contact portion of the plurality of conductive contact portions electrically connected thereto, and wherein each contact portion is physically distinguishable from the first and the second pluralities of conductive traces;

providing a semiconductor die mounted to the top surface of the substrate and electrically connected to the first plurality of conductive traces;

providing a plurality of conductive balls attached to the bottom surface of the substrate and electrically connected to the second plurality of conductive traces;

providing a test socket having a plurality of test contacts configured to be able to physically and electrically contact the plurality of conductive test contacts without physically contacting the plurality of conductive balls;

placing the substrate with the semiconductor die mounted thereto and the plurality of conductive balls attached thereto into the test socket such that the plurality of test contacts is in physical and electrical contact with the plurality of conductive contact portions and without being in physical contact with the plurality of conductive balls; and exercising the semiconductor die at a temperature in excess of 50° C. by sending electrical signals to the semiconductor die using the plurality of test contacts without the plurality of test contacts physically contacting the plurality of conductive balls.

9. The method of claim 8 wherein the step of exercising comprises burning-in the semiconductor die.

10. The method of claim 8 wherein the step of exercising comprises functionally testing the semiconductor die.

11. The method of claim 8 wherein the step of exercising comprises testing the semiconductor die for open circuits and testing the semiconductor die for short circuits.

12. The method of claim 8 wherein the step of exercising comprises exercising the semiconductor die at an ambient temperature wherein the ambient temperature is within 50° C. of a melting point of the plurality of conductive balls.

13. The method of claim 12 wherein the step of providing a plurality of conductive balls comprises providing a plurality of solder balls.

14. The method of claim 8 wherein the step of providing a substrate comprises providing a substrate wherein the plurality of conductive contact portions comprises a plurality of conductive contact castellations formed along the periphery of the substrate.

15. A method of testing a ball grid array semiconductor device comprising the steps of:

providing a substrate having a plurality of vias, a first plurality of conductive traces on a first surface, a second plurality of conductive traces on a second surface opposing the first surface, and a plurality of edge contacts, wherein each via of the plurality of vias electrically connects a first conductive trace of the first plurality of conductive traces to a second conductive trace of the second plurality of conductive traces and wherein the each via has an exclusively associated edge contact of the plurality of edge contacts which is electrically connected to the first conductive trace and the second conductive trace such that the exclusively associated edge contact is a redundant electrical connection to the first conductive trace and to the second conductive trace;

providing a semiconductor die mounted to the first surface of the substrate and electrically connected to the first plurality of conductive traces;

providing a plurality of conductive balls attached to the second surface of the substrate and electrically connected to the second plurality of conductive traces;

providing a test socket having a plurality of test contacts;

placing the substrate with the semiconductor die mounted thereto and with the plurality of conductive balls attached thereto into the test socket; and biasing the semiconductor die by physically contacting the plurality of edge contacts with the plurality of test contacts and applying power to the semiconductor die without permitting the plurality of test contacts to physically contact the plurality of conductive balls.

16. The method of claim 15 wherein the step of providing a substrate comprises providing a substrate wherein the plurality of edge contacts comprises a plurality of conductive castellations formed along a periphery of the substrate.

17. The method of claim 15 wherein the step of biasing is performed at a temperature in excess of 50° C.

18. The method of claim 17 wherein the step of biasing comprises burning-in the semiconductor die.

19. The method of claim 15 wherein the step of biasing comprises functionally testing the semiconductor die.

20. The method of claim 15 wherein the step of biasing comprises testing the semiconductor die for open circuits and testing the semiconductor die for short circuits.

21. A ball grid array semiconductor device comprising:
a substrate having a periphery, a first plurality of traces, a second plurality of traces, a plurality of vias which electrically connect the first plurality of traces to the second plurality of traces, and a plurality of conductive castellations formed along the periphery, wherein for each via of the plurality of vias there is one exclusively associated conductive castellation of the plurality of conductive castellations such that the each via and its exclusively associated conductive castellation are redundant electrical connections to a trace of the first plurality of traces and to a trace of the second plurality of traces;
a semiconductor die mounted to the substrate;
electrical connections between the semiconductor die and the first plurality of traces; and
a plurality of conductive balls attached to the substrate and electrically connected to the second plurality of traces, wherein each conductive ball of the plurality of conductive balls is associated with a via of the plurality of via and with its exclusively associated conductive castellation.

22. The ball grid array semiconductor device of claim 21 wherein the semiconductor die has a plurality of bonding pads as input/output terminals of the semiconductor die, and wherein the first plurality of traces includes a trace associated with each bonding pad of the plurality of bonding pads.

23. The ball grid array semiconductor device of claim 22 wherein the plurality of bonding pads includes all input/output terminals of the semiconductor die.

24. The ball grid array semiconductor device of claim 21 wherein the substrate is an organic substrate.

25. The ball grid array semiconductor device of claim 21 wherein the plurality of conductive balls comprises a plurality of solder balls.

26. The ball grid array semiconductor device of claim 25 wherein the plurality of solder balls is made of solder having a composition approximately that of eutectic solder.

* * * * *